US009465206B1

(12) United States Patent
Thijssen et al.

(10) Patent No.: US 9,465,206 B1
(45) Date of Patent: Oct. 11, 2016

(54) ADHESIVE/SEALING MATERIAL FOR AN ELECTROWETTING DEVICE

(71) Applicant: Amazon Technologies, Inc., Reno, NV (US)

(72) Inventors: Maurice Hendrikus Hubertinus Thijssen, Deurne (NL); Jeroen Cornelis van der Gaag, Mierlo (NL)

(73) Assignee: Amazon Technologies, Inc., Seattle, WA (US)

( * ) Notice: Subject to any disclaimer, the term of this patent is extended or adjusted under 35 U.S.C. 154(b) by 79 days.

(21) Appl. No.: 14/278,831

(22) Filed: May 15, 2014

Related U.S. Application Data

(60) Provisional application No. 61/935,789, filed on Feb. 4, 2014.

(51) Int. Cl.
| | |
|---|---|
| *G02B 26/00* | (2006.01) |
| *G02B 1/06* | (2006.01) |
| *G09G 3/28* | (2013.01) |
| *G09G 3/34* | (2006.01) |
| *B29C 65/48* | (2006.01) |

(Continued)

(52) U.S. Cl.
CPC ......... *G02B 26/005* (2013.01); *B29C 65/4845* (2013.01); *B29C 65/4885* (2013.01); *G02B 5/0242* (2013.01); *G02B 5/3058* (2013.01); *G02B 26/004* (2013.01); *G02B 2207/115* (2013.01); *G02F 1/1339* (2013.01); *G02F 1/155* (2013.01); *G02F 1/167* (2013.01); *G02F 2001/1678* (2013.01); *G02F 2202/36* (2013.01); *H01M 2/145* (2013.01); *H01M 10/0525* (2013.01)

(58) Field of Classification Search
CPC .. H01M 10/0525; H01M 2/145; G02B 1/16; G02B 1/18; G02B 26/004; G02B 5/0242; G02B 5/3058; G02F 1/167; G02F 1/1339; G02F 1/155; G02F 2001/1678; G02F 2202/36
USPC ........ 359/290–292, 295, 297, 298, 665–667; 345/60, 84, 107; 156/109, 250–253; 427/162, 58, 66; 106/419; 252/582
See application file for complete search history.

(56) References Cited

U.S. PATENT DOCUMENTS

| | | | | |
|---|---|---|---|---|
| 2005/0151709 | A1* | 7/2005 | Jacobson | G02B 26/005 345/84 |
| 2009/0122389 | A1* | 5/2009 | Whitesides | G08G 18/0823 359/296 |

OTHER PUBLICATIONS

Jose Vega-Baudrit et al, "Addition of nanosilicas with different silanol content to thermoplastic polyurethane adhesives," International Journal of Adhesion and Adhesives, 26 (2006), pp. 378-387.*

*Primary Examiner* — Evelyn A Lester
(74) *Attorney, Agent, or Firm* — Lee & Hayes, PLLC (57) ABSTRACT

Subject matter disclosed herein relates to improving a contact diameter of an adhesive/sealing material on surfaces of substrates by altering rheological properties of the adhesive/sealing material. An electrowetting display device comprises a first substrate and a second substrate, a first fluid and a second fluid disposed between the first substrate and the second substrate, wherein the first fluid is immiscible with the second fluid. An adhesive/sealing material comprising UV curable epoxy glue is in contact with the second fluid and couples the second substrate to the first substrate. The adhesive/sealing material further comprises silica particles in a range of 1-6% mass fraction of silica that alter rheological properties of the UV curable epoxy glue.

9 Claims, 9 Drawing Sheets

(51) Int. Cl.
*G02F 1/167* (2006.01)
*G02B 5/30* (2006.01)
*H01M 10/0525* (2010.01)
*G02F 1/1339* (2006.01)
*G02B 5/02* (2006.01)
*G02F 1/155* (2006.01)
*H01M 2/14* (2006.01)

ADHESIVE/SEALING MATERIAL FOR AN ELECTROWETTING DEVICE

CROSS REFERENCE TO RELATED APPLICATIONS

This claims priority to U.S. Provisional Patent Application No. 61/935,789, filed on Feb. 4, 2014, which is incorporated herein by reference.

BACKGROUND

Many portable electronic devices include displays for displaying various types of images. Examples of such displays include electrowetting displays (EWDs), liquid crystal displays (LCDs), electrophoretic displays (EPDs), light emitting diode displays (LED displays), etc. In EWD applications, two substrates or support plates are coupled together wholly or partially under or in contact with electrowetting fluids using an adhesive or other sealing material. After positioning a top substrate and filling the substrates with electrowetting fluids, the top substrate needs to be attached to a bottom substrate. A sealing material such as, for example, ultraviolet (UV) curable epoxy glue, is used for attaching the top and bottom substrates to one another. The uncured glue is dispensed in a desired pattern on the top substrate before the substrates filling process commences, wherein the glue can be dispensed in globular deposits or as a substantially continuous pattern of glue on the periphery of the top substrate before filling with electrowetting fluids and coupling the two substrates into a EWD device. During filling and coupling, the uncured glue is predominantly in contact with a second fluid of the two fluids. When the uncured glue comes into contact or is immersed in the second fluid, an undesirable fluid-flow phenomenon occurs that renders the application of the glue cumbersome, for example, when the glue is under the second fluid. This phenomenon can be explained with respect to FIG. 1, which is a cross-sectional view of a line of uncured glue on a substrate.

Figure 1:
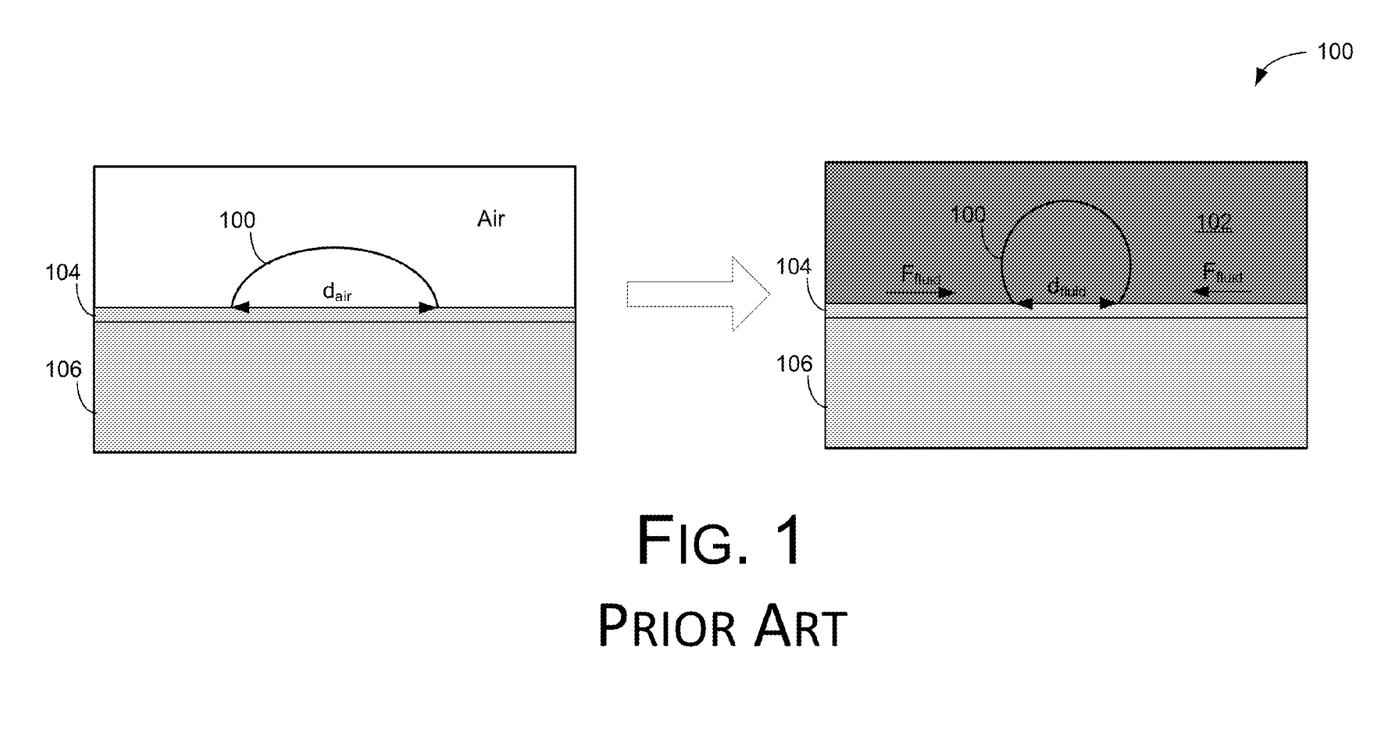
FIG. 1 is a schematic illustration of the effects of gravity and fluid on contact diameter of an adhesive/sealing material on a surface of a substrate.

When a line of uncured ultraviolet (UV) curable epoxy glue 100 is immersed in a second fluid 102, which, for example, may be electrically conductive or polar, and may be water or a salt solution such as a solution of potassium chloride in a mixture of water and ethyl alcohol, the dispensed UV curable epoxy glue 100 may be pushed back, adversely displaced or dismounted from the substrate by the force of the second fluid (represented as Ffluid in FIG. 1). The polarity of the second fluid 102 matches better with the polarity of a conducting layer of material such as an indium tin oxide (ITO) layer 104 (e.g., an ITO layer 104 on a substrate 106) in comparison to the polarity of the UV curable epoxy glue 100, since both the second fluid 102 and the ITO 104 are hydrophilic while the UV curable epoxy glue 100 is more hydrophobic. The second fluid 102 begins to compete with the UV curable epoxy glue 100 to wet the ITO surface 104. Because of this competition the contact diameter (d) of the UV curable epoxy glue 100 with the ITO surface 104 decreases (dair>dfluid), where dair represents the contact diameter of the UV curable epoxy glue 100 with the ITO surface 104 in air upon being initially dispensed and dfluid represents the contact diameter of the UV curable epoxy glue 100 with the ITO surface 104 in the second fluid 102. A decrease in contact diameter is a problem because it leads to a decrease in adhesion of the top and bottom substrates.

Accordingly, the behavior of the UV curable epoxy glue 100 under the fluid 102 results in drawbacks in manufacturing of EWD display devices. For example, extra time and space may be needed in the manufacturing line.

BRIEF DESCRIPTION OF THE DRAWINGS

The detailed description is described with reference to non-limiting and non-exhaustive embodiments illustrated in the accompanying figures. The same reference numerals in different figures refer to similar or identical items.

DETAILED DESCRIPTION

The present disclosure provides substances and techniques that provide for improving a contact diameter and influencing the wettability of an adhesive/sealing material on surfaces of substrates in electrowetting devices by altering rheological properties of the adhesive/sealing material.

In general, image display apparatuses, such as, for example, various electronic devices, including, but not limited to, portable computing devices, tablet computers, laptop computers, notebook computers, mobile phones, personal digital assistants (PDAs), and portable media devices (e.g., e-book devices, DVD players, etc.), display images on a display. Examples of such displays include, but are not limited to, LCDs, EWDs and EPDs.

More particularly, a display device, such as an electrowetting display device, for example, can be a thin film transistor electrowetting display (TFT-EWD) that generally includes an array of transmissive, reflective and/or transflective pixels configured to be operated by an active matrix addressing scheme. For example, rows and columns of pixels are operated by controlling voltage levels on a plurality of source lines and gate lines. In this fashion, the display device can produce an image by selecting particular pixels to transmit, reflect or block light. Pixels are addressed (e.g., selected) via rows and columns of the source lines and gate lines that are connected to transistors (e.g., used as switches) included in each pixel. Transistors take up a relatively small fraction of the area of each pixel. For example, the transistor can be located underneath the reflector in reflective displays.

Electrically, the pixel is a small capacitor with a layer of insulating optical material (e.g., liquid crystal material or electrowetting material) sandwiched between two substrates, wherein each substrate generally includes a transparent conductive indium tin oxide (ITO) layer. A one-way current-passing characteristic of the transistor of the pixel prevents charge that is being applied to the pixel from draining between refresh cycles of the display's image.

An electrowetting display employs an applied voltage to change the surface tension of a liquid in relation to a surface. For instance, by applying a voltage to a hydrophobic surface via a pixel electrode in conjunction with a common electrode, the wetting properties of the surface can be modified so that the second fluid has a greater affinity for the surface. Hydrophobic generally refers to repelling polar fluids while hydrophilic generally refers to having an affinity for polar fluids. As one example of an electrowetting display, the modification of the surface energy by applying a voltage causes the electrolyte, considered to be the second fluid, in an electrowetting liquid in individual pixels of the display to adhere to the modified surface and thus, replace a colored electrowetting oil layer in individual pixels of the display. The electrowetting oil layer is generally made up of an oil that is electrically non-conductive and may for instance be an alkane like hexadecane or silicone oil. Thus, the electrowetting fluids in the individual pixels of the display responding to the change in surface tension act as an optical switch. When the voltage is absent, the colored electrowetting oil forms a continuous film within a pixel, and the color may thus be visible to a user of the display. On the other hand, when the voltage is applied to the pixel, the colored electrowetting oil is displaced and the pixel becomes transparent. When multiple pixels of the display are independently activated, the display can present a color or grayscale image. The pixels may form the basis for a transmissive, reflective, or transmissive/reflective (transreflective) display. Further, the pixels may be responsive to high switching speeds (e.g., on the order of several milliseconds), while employing small pixel dimensions. Accordingly, the electrowetting displays herein may be suitable for applications such as displaying video and/or static content. In addition, the low power consumption of electrowetting displays in general makes the technology suitable for displaying content on portable display devices that rely on battery power.

To provide a suitable seal to attach the two substrates, an ideal adhesive for gluing and sealing under fluids, such as the second fluid, would be an adhesive that does not change geometry if it is dispensed in air or immersed in a fluid. In an embodiment, the rheology or rheological properties of the adhesive or sealing material are changed. This can be achieved by, for example, increasing the viscosity of the adhesive. Moreover, high viscosity adhesive may have additional drawbacks, for example, the adhesive may become very hard to dispense from its dispenser or dispensing apparatus during manufacturing.

Moreover, to provide a suitable seal to attach the two substrates, the surface tension, for example, of the second fluid may have a surface tension surface tension greater than 35, 40, 45 or 50 mN m <1>. The surface tension of the adhesive or seal may be greater than 40, 45, or 50 mN m <1>.

Figure 2A:
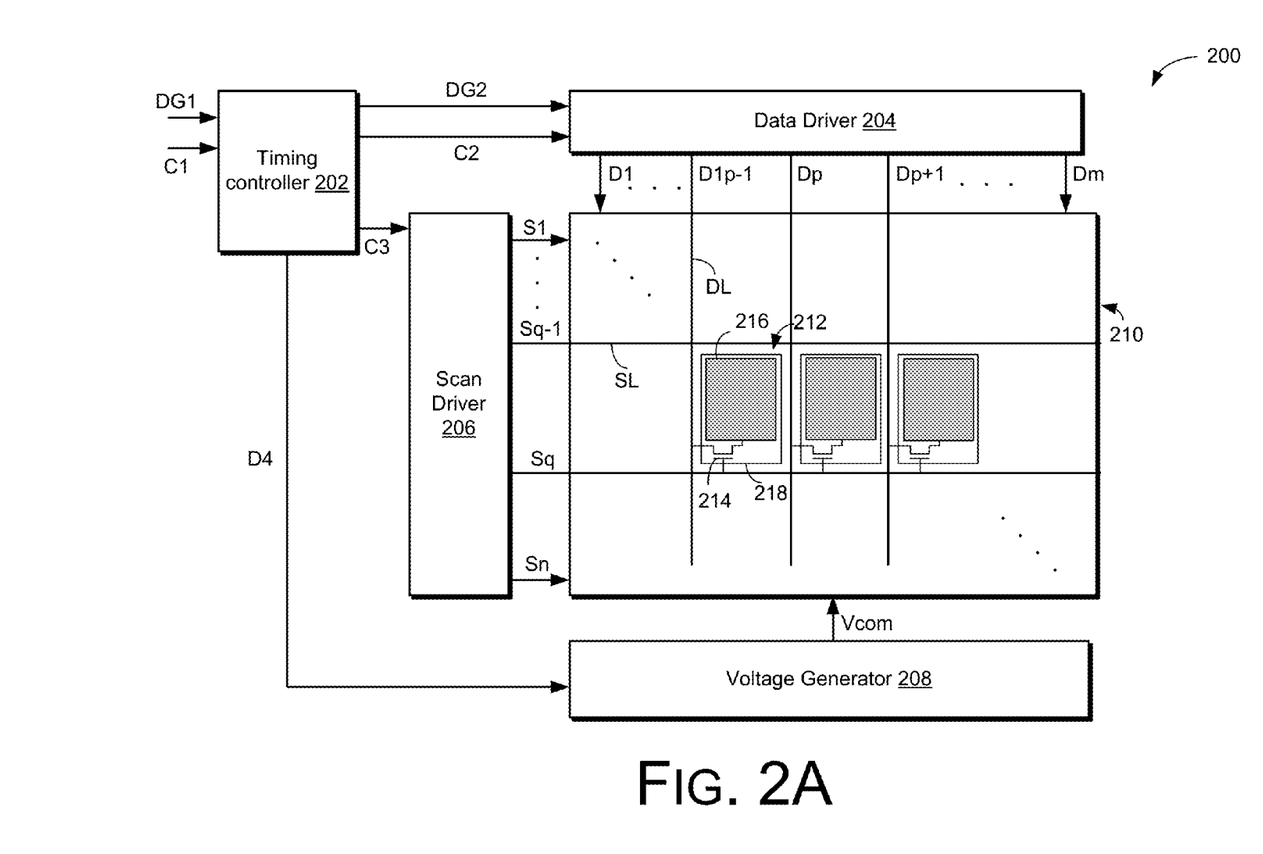
FIG. 2A is a schematic view of an example of an electrowetting display device, according to various embodiments.

Referring to FIG. 2A, an example of an electrowetting display device 200 is schematically illustrated that includes a timing controller 202, a data driver 204, a scan driver 206, a voltage generator 208, and an electrowetting display panel 210. The electrowetting display panel 210 is driven by the timing controller 202, the data driver 204, the scan driver 206, and the voltage generator 208.

As an example of general operation of the electrowetting display device 200, responsive to a first data signal DG1 and a first control signal C1 from an external source, e.g., a graphic controller (not illustrated), the timing controller 202 applies a second data signal DG2 and a second control signal C2 to the data driver 204; a third control signal C3 to the scan driver 206; and a fourth control signal C4 to the voltage generator 208.

The data driver 204 converts the second data signal DG2 to voltages, i.e., data signals, and applies the data signals D1, . . . , Dp−1, Dp, Dp+1, . . . , Dm to the electrowetting display panel 210. The scan driver 206 sequentially applies scan signals S1, . . . , Sq−1, Sq, . . . , Sn to the electrowetting display panel 210 in response to the third control signal C3.

The voltage generator 208 applies a common voltage Vcom to the electrowetting display panel 210 in response to the fourth control signal C4. Although not illustrated in FIG. 2A, the voltage generator 208 generates various voltages required by the timing controller 202, the data driver 204, and the scan driver 206.

The electrowetting display panel 210 includes m data lines DL, i.e., source lines, to transmit the data voltages and n gate lines SL, i.e., scan lines, to transmit a gate-on signal.

Pixel areas 212 are positioned adjacent to crossing points of the data lines DL and the gate lines SL crossing the data lines DL. Each pixel area 212 is made up of a hydrophobic surface that includes a thin film transistor 214 and a pixel electrode 216 under the hydrophobic surface. A partition wall 218 defines the pixel area 212. Pixel areas 212 can represent pixels within the electrowetting display device 200 or sub-pixels within the electrowetting display device 200, depending upon the application for the electrowetting display device 200.

Figure 2B:
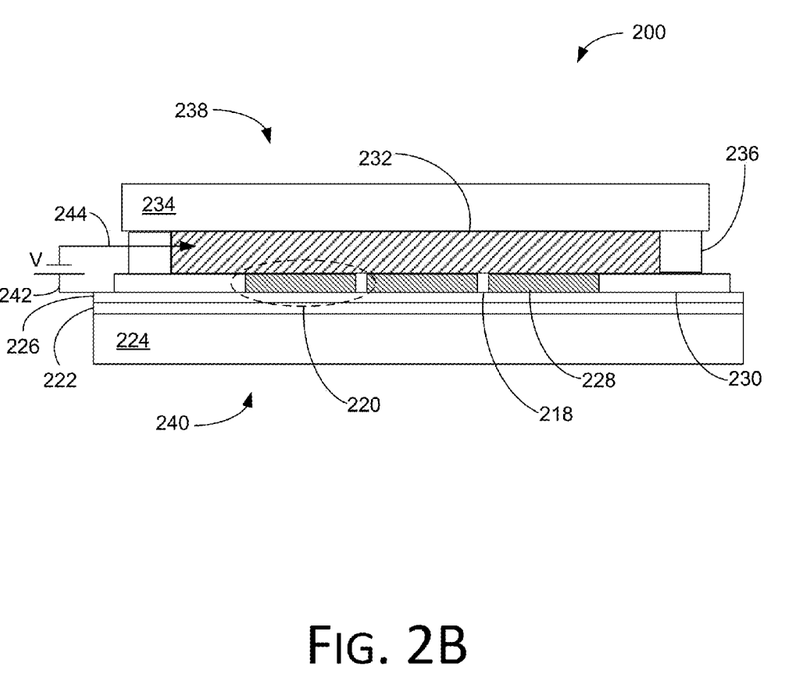
FIG. 2B is a cross-section of a portion of the electrowetting display device of FIG. 2A, according to some embodiments.

FIG. 2B is a cross-section of a portion of the electrowetting device 200 illustrating several electrowetting elements 220 that generally correspond to pixel areas 212, according to some embodiments. An electrode layer 222 that includes the pixel electrodes 216 (not illustrated in FIG. 2B) is formed on a bottom support plate 224. In some implementations, a dielectric barrier layer (not illustrated) may at least partially separate the electrode layer 222 from a hydrophobic layer 226 also formed on the bottom support plate 224 over the electrode layer 222. Such separation can, among other things, prevent electrolysis occurring through the hydrophobic layer 226. In some implementations, the hydrophobic layer 226 can comprise a fluoropolymer, such as AF1600, produced by DuPont, based in Wilmington, Del. The pixel walls 218 form a patterned electrowetting element grid on the hydrophobic layer 226, as can be seen in FIG. 2A. The pixel walls 218 may comprise a photoresist material, such as epoxy-based negative photoresist SU-8. The patterned electrowetting element grid comprises rows and columns that form an electrowetting element array (e.g., electrowetting display panel 210) of field electrowetting elements and border electrowetting elements. For example, an electrowetting element can have a width and length in a range of about 50 to 500 microns. A first fluid 228, which can have a thickness in a range of about 1 to 10 microns, for example, overlies the hydrophobic layer 226. The first fluid 228 is generally an electrowetting oil and is partitioned by the pixel walls 218 of the patterned electrowetting element grid. An outer rim 230 can comprise the same material as the pixel walls 218. A second fluid 232, such as a fluid that includes an electrolyte, overlies the electrowetting oil 228 and the pixel walls 218 of the patterned electrowetting element grid.

A top support plate 234 covers the second fluid 232 and edge seals 236 retain the second fluid 232 over the electrowetting element array. The bottom support plate 224 and the top support plate 234 may be separate parts of individual electrowetting elements or the bottom support plate 224 and the top support plate 234 may be shared by a plurality of electrowetting elements. The bottom support plate 224 and the top support plate 234 may be made of glass or polymer and may be rigid or flexible, for example.

A voltage V applied across the second fluid 232 and the dielectric barrier layer stack (e.g., comprising the electrode layer 222 and the hydrophobic layer 226) of individual electrowetting elements can control transmittance or reflectance of the individual electrowetting elements.

The electrowetting display device 200 has a viewing side 238 on which an image or display formed by the electrowetting display device 200 can be viewed, and a rear side 240. The top support plate 234 faces viewing side 238 and the bottom support plate 224 faces the rear side 240. The top support plate 234 is coupled to the bottom support plate 224 with an adhesive or sealing material (not illustrated). In an alternative embodiment, the electrowetting display device 200 may be viewed from the rear side 240. The electrowetting display device 200 may be a reflective, transmissive or transreflective type. The electrowetting display device 200 may be a segmented display type in which the image is built up of segments. The segments can be switched simultaneously or separately. Each segment includes one electrowetting element 220 or a number of electrowetting elements 220 that may be neighboring or distant from one another. The electrowetting elements 220 included in one segment are switched simultaneously, for example. The electrowetting display device 200 may also be an active matrix driven display type or a passive matrix driven display, just to name a few examples.

The second fluid 232 is immiscible with the first fluid 228. Generally, immiscible refers to the inability of the second fluid 232 to mix or blend with the first fluid 228. The second fluid 232 generally includes an electrolyte and is electrically conductive or polar. The second fluid 232 may be water or a salt solution such as a solution of potassium chloride in a mixture of water and ethyl alcohol, for example. The second fluid may comprise at least one component selected from the group consisting of: ethylene glycol; diethyleneglycol; polyethylene glycol; propylene glycol; dioxalane; glyoxal; citric acid; oxalic acid; oxamic acid; and formic acid; and includes a second component which is different from the first component and is selected from the group consisting of: erythritol; ethylene glycol; ethylene carbonate; propylene carbonate; glycerol; and butanetriol.

The second fluid 232 is preferably transparent, but may be colored, white, absorbing or reflecting. The first fluid 228, generally referred to as electrowetting oil, is electrically non-conductive and may for instance be an alkane like hexadecane or silicone oil. The hydrophobic layer 226 is arranged on the bottom support plate 224 to create an electrowetting surface area. The hydrophobic character causes the first fluid 228 to adhere preferentially to the bottom support plate 224 since the first fluid 228 has a higher wettability with respect to the surface of the hydrophobic layer 226 than it has with respect to the second fluid 232. Wettability relates to the relative affinity of a fluid for the surface of a solid. Wettability increases with increasing affinity, and it can be measured by the contact angle formed between the fluid and the solid and measured internal to the fluid of interest. For example, such a contact angle can increase from relative non-wettability of more than 90° to complete wettability at 0°, in which case the fluid tends to form a film on the surface of the solid.

The electrode layer 222 is separated from the first fluid 228 and the second fluid 232 by an insulator, which may be the hydrophobic layer 226. The electrode layer 222 (and thereby the electrodes 216) is supplied with voltage signals V by a first signal line 242 as will be further described herein. A second signal line 244 is electrically connected to a top electrode (not illustrated) that is in contact with the conductive second fluid 232. This top electrode may be common to more than one electrowetting element 220 since the electrowetting elements 220 are fluidly interconnected by and share the second fluid 232 uninterrupted by the pixel walls 218. The electrowetting elements 220 are controlled by the voltage V applied between the first and second signal lines 242 and 244.

The first fluid 228 absorbs at least a part of the optical spectrum. The first fluid 228 may be transmissive for a part of the optical spectrum, forming a color filter. For this purpose, the first fluid 228 may be colored by addition of pigment particles or dye, for example. Alternatively, the first fluid 228 may be black (e.g., absorbing substantially all parts of the optical spectrum) or reflecting. The hydrophobic layer 226 may be transparent or reflective. A reflective layer may reflect the entire visible spectrum, making the layer appear white, or part of it, making it have a color.

When the voltage V applied between the signal lines 242 and 226 is set at a non-zero active signal level, the electrowetting element 220 will enter into an active state. Electrostatic forces will move the second fluid 232 toward the electrode layer 222, thereby repelling the first fluid 228 from the area of the hydrophobic layer 226 to the pixel walls 218 surrounding the area of the hydrophobic layer 226, to a drop-like form. This action uncovers the first fluid 228 from the surface of the hydrophobic layer 226 of the electrowetting element 220. When the voltage across the electrowetting element 220 is returned to an inactive signal level of zero or a value near to zero, the electrowetting element 220 will return to an inactive state, where the first fluid 228 flows back to cover the hydrophobic layer 226. In this way, the first fluid 228 forms an electrically controllable optical switch in each electrowetting element 220.

Generally, the thin film transistor 214 includes a gate electrode (not illustrated) that is electrically connected to a corresponding scan line of the scan lines SL, a source electrode (not illustrated) is electrically connected to a corresponding data line (e.g., first signal line 242 of FIG. 2B) of the data lines DL, and a drain electrode (not illustrated) is electrically connected to the pixel electrode 216. Thus, the pixel areas 212 are operated based upon the scan lines SL and the data lines DL of FIG. 2A.

Figure 3A:
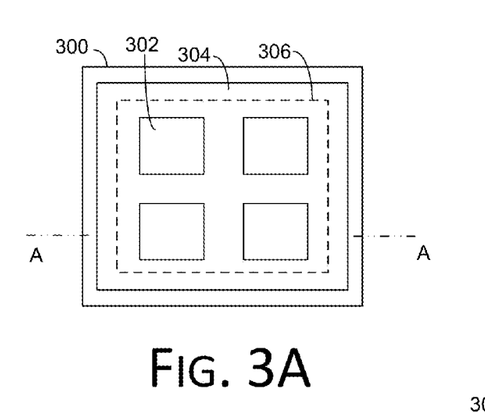
FIGS. 3A-3C are schematic views illustrating simplified example stages of assembly of a portion of the electrowetting display device of FIGS. 2A and 2B.
Figure 3B:
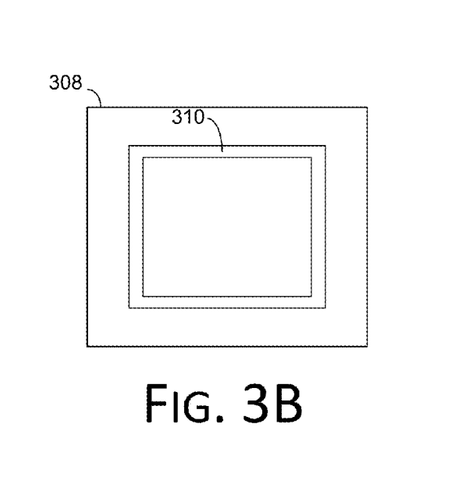
Figure 3C:
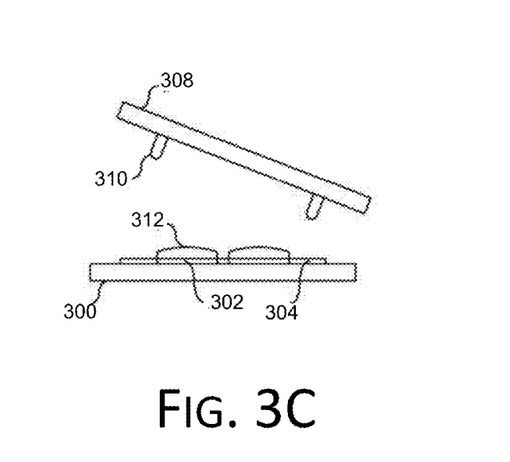

For briefly describing an example of a manufacturing process of the electrowetting elements of electrowetting display device 200, reference is made to FIGS. 3A-3C. For clarity, FIGS. 3A-3C do not include many of the elements previously described with respect to FIGS. 2A-2B.

FIG. 3A schematically illustrates a top view of a first substrate 300 (e.g., bottom support plate 224). The first substrate 300 includes four first surface areas 302 that are less wettable to the second fluid 232 (not illustrated in FIG. 3A) and a second surface area 304 that is more wettable to the second fluid 232. More or fewer first surface areas 302 may be included. The second surface area 304 encloses the first surface areas 302. The four first surface areas 302 correspond to four picture elements (e.g., pixel areas 212) of the electrowetting display device 200 and are arranged within a display region 306 (e.g., display panel 210). When the first fluid 228 is an electrowetting oil and the second fluid 232 is water, for example, the first surface areas 302 are hydrophobic and the second surface area 304 is hydrophilic.

The wettability properties of the surface areas may be obtained by a suitable choice of substrate material, treatment of the substrate surface or application of a layer on the substrate surface. For clarity sake, the figures illustrate the surface areas as a layer. When the substrate material provides the properties of the second surface area 304, the second surface area extends to the edge of the first substrate 300 in FIG. 3A.

As previously noted, the first surface areas 302 may be formed, for example, by an amorphous fluoropolymer layer such as AF1600 or another low surface energy polymer. The hydrophobic character causes the first fluid 228 to adhere preferentially to the first surface areas 302 since the hydrophobic layer (e.g., hydrophobic layer 226) has a higher wettability with respect to the first fluid 228 than it has with respect to the second fluid 232. The second surface areas 304 may be formed by a photoresist layer, for example SUB. Where it is stated herein that adhesive or sealing material is attached to, or a fluid is applied to the first substrate 300 or a surface or surface area of the first substrate 300, the first substrate 300 is regarded as including any solid layers arranged on the first substrate 300 (e.g., bottom support plate 224) as previously discussed herein, such as, for example, the layers controlling the wettability properties.

FIG. 3B schematically illustrates a top view of a second substrate 308 (e.g., top support plate 234). An adhesive/sealing material 310 (e.g., edge seals 236) is in contact with the second substrate 308 in a pre-determined pattern, in this example embodiment a square shape enclosing the display region 306. The adhesive/sealing material 310 is generally an adhesive such as, for example, ultraviolet (UV) curable epoxy glue, and may be dispensed using an injector (not illustrated), such as a syringe or other device having an appropriately dimensioned orifice, that is configured to follow the pre-determined pattern. Thus, the adhesive/sealing material 310 being in contact with the second substrate 308 means that the adhesive/sealing material 310 is in contact with and may at least partially be adhered to the second substrate 308. To avoid a non-uniform thickness of adhesive/sealing material 310 in the pattern due to the start of the injection of the adhesive/sealing material 310, the injection is preferably started outside the display region 306 and then continues towards the pre-determined pattern. Alternatively, the adhesive/sealing material 310 may have the form of a seal frame (not illustrated) that is defined on the first substrate 300. Where it is stated herein that adhesive or sealing material is attached to, or a fluid is applied to the second substrate 308 or a surface or surface area of the second substrate 308, the second substrate 308 is regarded as including any solid layers arranged on the second substrate 308 (e.g., top support plate 234) as previously discussed herein, such as, for example, an ITO layer.

FIG. 3C schematically illustrates a cross-section of the first and second substrates 300 and 308 before assembly of the two substrates 300, 308. The cross-section is along the line A-A in FIG. 3A. FIG. 3C illustrates the strip of adhesive/sealing material 310 also in cross-section. The first substrate 300 has been provided with the first fluid 228 adjoining only the first surface areas 302. A method of applying the first fluid 228 on the first substrate 300 is to submerge the first substrate 302 in a bath of the second fluid 232, e.g. water. The first fluid 228, e.g., electrowetting oil, is dispensed on the surface of the first substrate 302 by a dispenser (not illustrated) having an elongated opening close to the surface of the first substrate 300 and submerged in the second fluid 232. The dispenser is moved over the surface of the first substrate 300 in a direction perpendicular to the long direction of the elongated opening. The first fluid is dispensed over the length of the dispenser as a thin film of first fluid 228. Since the surface of the first substrate 300 comprises first surface areas 302 that are more wettable with respect to the first fluid 228 than to the second fluid 232 and second surface areas 304 that are more wettable to the second fluid 232, the first fluid 228 will preferentially adjoin the first surface areas 302 and will not cover the second surface areas 304.

When the above method of applying the first fluid 228 is used, the step of joining the two substrates 300, 308 with the adhesive/sealing material 310 is generally carried out in the bath of the second fluid 232. The second substrate 308 is put into the bath, where care is taken that no air is trapped under the second substrate 308. The two substrates 302, 308 are aligned and pressed together such that the two substrates 300, 308 obtain a desired distance from one another. The adhesive/sealing material 310 defines a sealing member between the two substrates 300, 308. Since the adhesive/sealing material 310 is generally an adhesive, the adhesive/sealing material 310 also generally attaches the first substrate 300 and the second substrate 308 together. The adhesive/sealing material 310 closes off a cavity 312 between the two substrates 300, 308. The cavity 312 comprises the first fluid 228 adjoining the first surface areas 302 and the second fluid 232 trapped in the cavity 312. FIGS. 3A-3C are schematic and may exaggerate some dimensions for the sake of clarity.

Another method of applying the two fluids 228, 232 on the first substrate 300 and subsequently sealing the fluids 228, 232 within the cavity 312 using the second substrate 308 is described as a slit filling method, which is briefly described below and is published as WO 2012 126851, the contents of which are incorporated herein by reference.

The slit filling method is a method of providing a layer of the first fluid 228 on the first surfaces 302 of the first substrate 300 using an elongate applicator (not illustrated), with an elongate gap being formed between the applicator and the surfaces 302. The gap is filled with an elongate globule of the first fluid 228 and an amount of the second fluid 232 is arranged in contact with the applicator and with the globule of the first fluid 228. As previously noted, the first fluid 228 and the second fluid 232 are immiscible. Also, as previously noted, the first areas 302 have a higher wettability for the first fluid 228 than for the second fluid 232. The slit filling method further includes applying a relative motion between the applicator and the first surfaces 302 of the first substrate 300. The amount of the second fluid 232 is arranged only on a trailing side of the applicator. The first substrate 300 does need not be submersed in a bath filled with the second fluid 232 as previously described. Instead, application of a relatively small amount of the second fluid 232 between the applicator and the first substrate 300 suffices. Other surfaces of the first substrate 300 can be kept free from the second fluid 232, thereby reducing the requirements of cleaning these surfaces after application of the slit filling method. The slit filling method also obviates the need for large volumes of the second fluid 232. The applicator may move with respect to the surface of the first substrate 300. The surface of the first substrate 300 may also be moved with respect to the applicator. The applicator distributes the first fluid 228 over the surface of the first substrate 300 and thereby acts as a spreader. Since the amount of the second fluid 232 is only at the trailing side of the applicator, the surface of the first substrate 300 in front of the applicator is not covered with the second fluid 232. The surface of the first substrate 300 in front of the applicator is preferably adjoined by a gas, such as air. When the applicator passes over the surface of the first substrate 300, a layer of the first fluid 228 is deposited on the first areas 302 and a layer of the second fluid 232 is deposited on the layer of first fluid 228. The second fluid 232 will not displace the first fluid 228 from the first surfaces 302 because of the higher wettability of the first surfaces 302 for the first fluid 228. The substrates 300, 308 are subsequently attached to one another and sealed via the adhesive/sealing material 310 to contain the fluids 228, 232, or the substrates 300, 308 may be attached to one another and sealed via the adhesive/sealing material 310 as the substrate 300 is being filled.

The previously described two methods for applying the two fluids 228, 232 on the first substrate 300 and subsequently sealing the fluids 228, 232 within the cavity 312 using the second substrate 308 are merely examples. Other methods and steps are also possible. For example, the adhesive/sealing material 310 may be applied to the first substrate 300 or to both substrates 300, 308, in various methods.

In accordance with various embodiments, the rheology or rheological properties of the adhesive/sealing material 310 (generally in the form of sealing material, adhesive, glue, etc.) are changed. This can be achieved by, for example, increasing the viscosity of the adhesive/sealing material 310. Rheology generally relates to the flow and deformation of materials under applied forces. Generally, the adhesive/sealing material 310 may exhibit complex rheological properties, whose viscosity and viscoelasticity can vary depending upon the external conditions applied, such as stress, strain, timescale and temperature.

To alter the rheology of the adhesive/sealing material 310 such that the adhesive/sealing material's geometry is not altered adversely, i.e. minimally deformed, after dispensing or immersing in a fluid, such as the second fluid 232, a Yield Stress is introduced in the adhesive/sealing material 310. The introduction of a Yield Stress into the adhesive/sealing material 310 helps ensure that the adhesive/sealing material 310 does not move or displace itself if a force of a liquid is applied to the adhesive/sealing material 310 that is lower than the Yield Stress. Generally, the adhesive/sealing material 310 will not geometrically change if:

$$\text{Yield stress} > F_{gravity} \text{ and Yield Stress} > F_{fluid} \quad (1)$$

where $F_{gravity}$ represents the force due to gravity and $F_{fluid}$ represents the force due to the second fluid 232 on the adhesive/sealing material 310.

To dispense the adhesive/sealing material 310 with a Yield Stress, the applied dispense force generally needs to be higher than the Yield Stress (Dispense Force>Yield Stress). At a dispense force higher than the Yield Stress, the adhesive/sealing material 310 will move while the viscosity is still relative low, which makes the adhesive/sealing material 310 easier to dispense from its dispenser than other high viscosity glues.

Figure 4A:
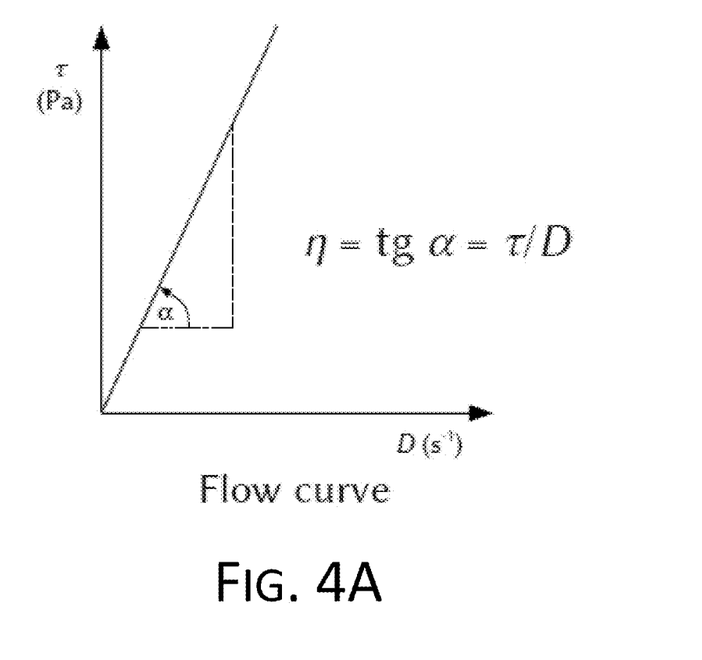
FIGS. 4A-4C are graphs illustrating yield stress and viscosity in Newtonian fluids, non-Newtonian fluids and real systems, respectively.
Figure 4B:
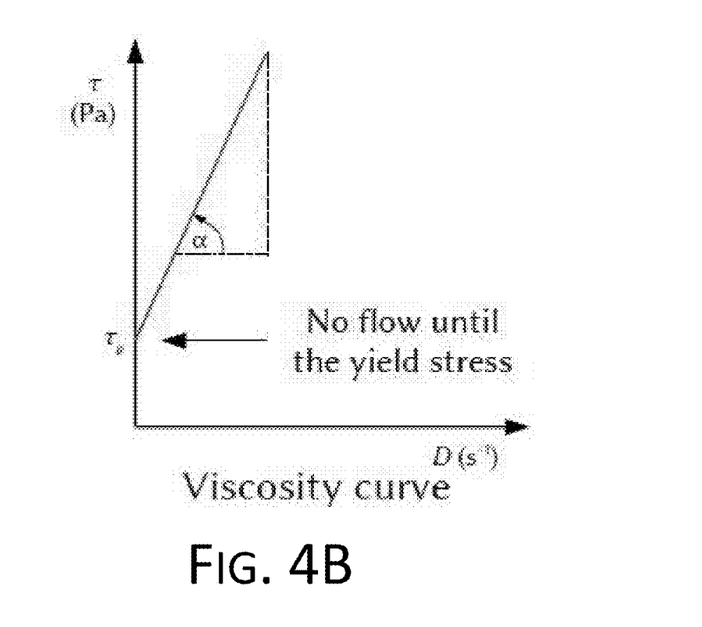
Figure 4C:
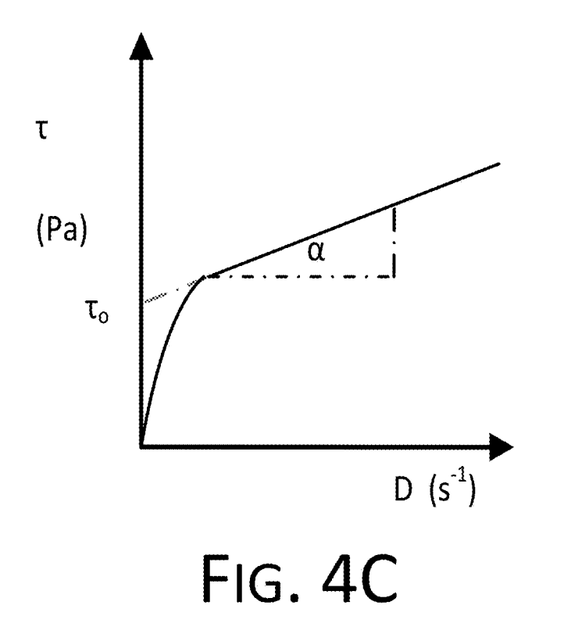

In one example, the adhesive/sealing material 310 comprises a UV curable glue that is specified by a viscosity (η) of 120 Pa*s at 25° C. As no shear rate is given at which this viscosity is reached, it implies Newtonian behavior: viscosity in Newtonian systems is described as the quotient of Shear Tension (τ) and Shear rate (D); for Newtonian fluids this quotient is constant at all shear rates. FIGS. 4A and 4B illustrate yield stress and viscosity Newtonian fluids and non-Newtonian fluids, respectively. FIGS. 4A and 4B are theoretical curves. FIG. 4C illustrates yield stress and viscosity in real systems. By choosing a material for adhesive/sealing material 310 that has a Yield Stress it is possible to have a viscosity that is also 120 Pa*s at 25° C., but that doesn't settle after it is dispensed (Shear rate=0). Viscosity of the adhesive/sealing material 310 aids in overcoming the hydrophilic preference of the electrolyte, i.e. the second fluid 232, to wet the surface and achieve good contact of the adhesive/sealing material 310 with the surface.

In accordance with various embodiments, in order to increase the Yield Stress of the adhesive/sealing material 310, silica particles are added to UV curable epoxy glue that comprises, for example, a two-part epoxy to introduce the Yield Stress. Silica particles can also be incorporated in UV curable epoxy glue that comprises a one-part epoxy in order to introduce a Yield Stress in the adhesive/sealing material 310.

Generally, any glue or sealing material may be used in which silica particles may be incorporated. It has been shown that at least 1% mass fraction of silica particles are generally required in the glue in order to produce the desired effect of providing a durable and effective seal to provide a mechanically stable electrowetting device, along with long term display device integrity. Hydrophobic silica particles may be more advantageous because they have a very advantageous effect in hydrophobic glue. Silica is generally hydrophilic. Hydrophobic silica is silica that has hydrophobic groups chemically bonded to the surface. Hydrophobic silica can be made both from fumed and precipitated silica. The hydrophobic groups are normally alkyl or polydimethylsiloxane chains. Examples of hydrophobic silica particles include Aerosil® R202 and Aerosil® R805. However, hydrophilic particles also have an advantageous effect in a hydrophilic glue. An example of hydrophilic silica includes Aerosil® 300. In the examples herein, the silica consists of small silica particles, where the primary particle size is in a range of about 7-40 nanometers (nm).

It has been found that with glues from companies such as, for example, Sekisui and Nagase, a range of 1 to 6% mass fraction of silica added to the glue provides a sufficient Yield Stress to resist the force of the second fluid 232 (e.g., $F_{fluid}$) while still allowing for viscosity of the glue to be low enough to allow for dispensing of the glue.

Figure 5:
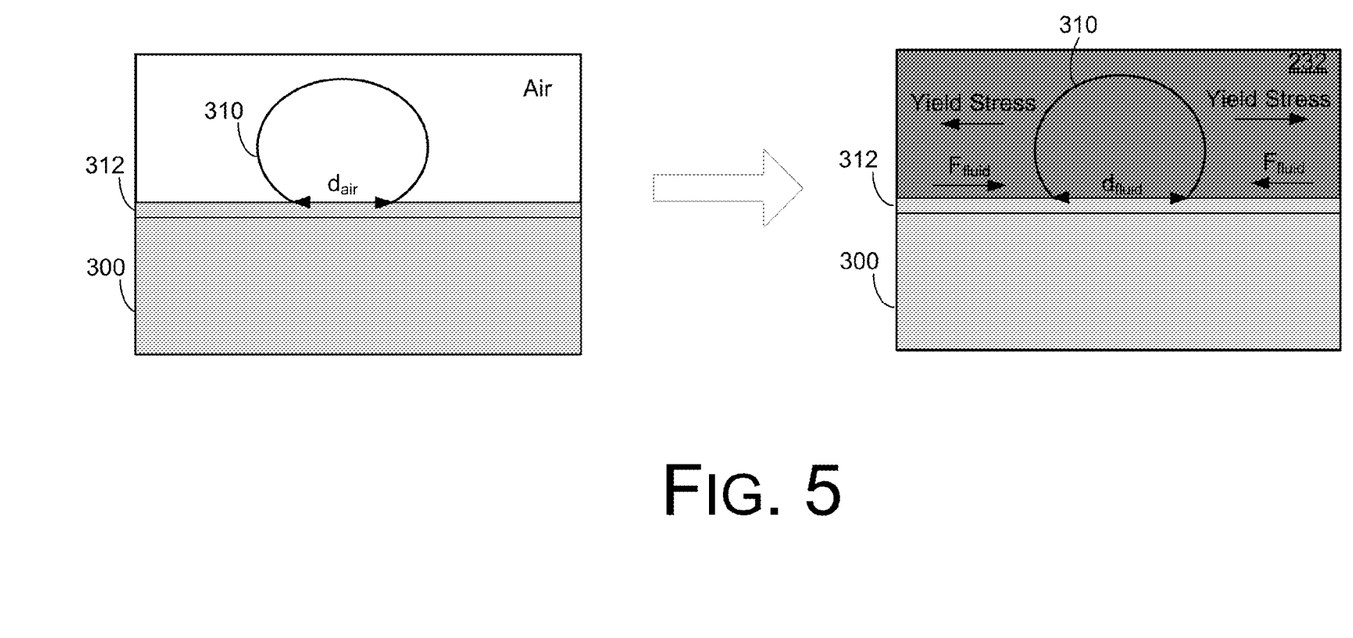
FIG. 5 is a schematic illustration of the effects of gravity and fluid on contact diameter of an adhesive/sealing material on a surface of a substrate, where rheological properties of the adhesive/sealing material have been altered.

Thus, as can be seen in FIG. 5, the net contact area $d_{air}$ of glue on a surface 312 (e.g., an ITO layer) of the second substrate 308 in air will generally be substantially maintained such that the net contact area $d_{fluid}$ on the surface 312 of the second substrate 308 once the second fluid 232 is introduced (i.e. once the substrate with the adhesive/sealing material 310 is in contact with or completely immersed in the second fluid 232) is substantially equal to the net contact area $d_{air}$. Thus, the glue has minimally deformed due to the presence of the second fluid 232. Advantageously $d_{fluid}$ is such that the interface between 310 and surface 312 is substantially perpendicular. This leads to improved adhesion of the glue with the increased Yield Stress from the silica introduced particles (e.g. adhesive/sealing material 310) on the surface 312 of the second substrate 308, as well as improved adhesion on a surface (e.g., hydrophobic layer 226) of the first substrate 300 when the two substrates 300, 308 are coupled to one another.

As much as 6-10% mass fraction of silica added to the glue provides a good Yield Stress to resist the force of the second fluid 232 (e.g., $F_{fluid}$ of equation (1)) but may increase the viscosity of the glue such that it is more difficult to allow for dispensing of the glue.

In general, the particles are capable of forming a three-dimensional network when the bulk material (i.e., the glue or sealing material) is in rest. If the shear stress (higher than the Yield Stress) is applied to the bulk material, the three-dimensional network is broken and the bulk material starts flowing. Generally, the ability for silica to build a network strongly depends on the polarity of the silica and the polarity of the bulk material into which the silica particles are dispersed.

Other particles that may be incorporated in the adhesive/sealing material 310 are clay particles, for example, which have a similar effect as the silica particles. Generally, ceramic particles also fulfill the same effect and thus may be suitable particles for incorporation into glue for increasing Yield Stress within the adhesive/sealing material 310. In these examples, the particles also consist of small particles, where the primary particle size of the clay particles and the primary size of the ceramic particles is in a range of about 7-40 nm. Additionally, in these examples, a range of 1 to 6% mass fraction of clay particles or ceramic particles added to the glue provides a sufficient Yield Stress to resist the force of the second fluid 232 (e.g., $F_{fluid}$) while still allowing for viscosity of the glue to be low enough to allow for dispensing of the glue. In various embodiments, a combination of silica particles, clay particles and/or ceramic particles may be used, where a range of 1 to 6% total mass fraction of the combination of silica particles, clay particles and/or ceramic particles is added to the glue.

Generally, epoxies, acrylates, silicones and hot-melt are types of glues or sealing materials that may be used. Incorporated with each of these glues can be the following particles: bentonite, iron-oxide, nano-carbon tubes or microsized particles, Microsized and Nanosized Calcium Carbonate, and Salts of aluminium and calcium such as stearates, octoates and naphthenates.

Accordingly, electrowetting devices, e.g., electrowetting display device 200, can be made in accordance with methods described herein using adhesives, glues, sealing materials, etc. that have an increased Yield Stress due to the inclusion of particles in the adhesives, glues, sealing materials, etc. This allows for better adhesion of the adhesives, glues, sealing materials, etc. on the substrates, when the first or second substrate is processed in the presence of a fluid such as the second fluid, thereby leading to improved attachment of and sealing between the substrates. Resistance of the sealing material/adhesive to flow of the fluid results in less inclusions in the sealing material/adhesive and thus a more homogeneous barrier, which is more robust to leakage paths for fluids through the barrier.

While embodiments of the present disclosure have been described with respect to electrowetting displays, other types of displays can benefit from the present disclosure. For example, LCDs, electrophoretic displays, cholesteric LCDs, and other display technologies that utilize fluids can benefit from the present disclosure and thus, the present disclosure is not limited to electrowetting displays.

Additionally, while embodiments of the present disclosure have been described with respect to coupling and/or sealing two substrates, more than two substrates may be coupled and/or sealed in accordance with various embodiments. For example, more than two substrates may be required in sealing a multi-layered electrowetting device. Three substrates may be coupled together, wherein the top two substrates may require an adhesive/sealing material as described herein so as to couple the three substrates.

Figure 6:
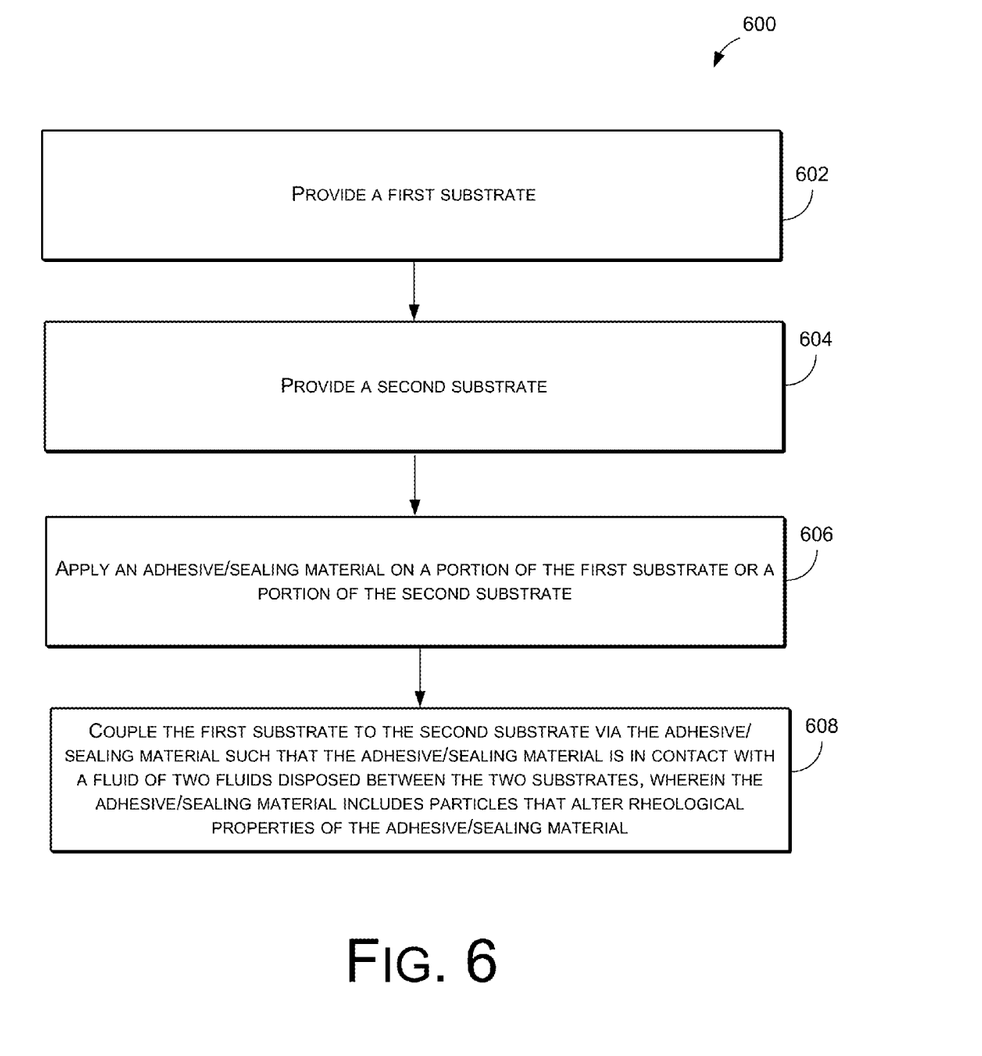
FIG. 6 is a flowchart illustrating an example of a process of coupling two substrates in manufacturing an electrowetting device.

FIG. 6 is a flowchart illustrating a process 600 of coupling two substrates during manufacturing of an electrowetting device, for example an electrowetting device as described in FIGS. 2A, 2B, 3A, 3B and 3C. At 602, a first substrate is provided. At 604, a second substrate is provided. At 606, an adhesive/sealing material is applied on a portion of the first substrate or a portion of the second substrate. At 608, the first substrate is coupled to the second substrate via the adhesive/sealing material such that the adhesive/sealing material is in contact with an electrowetting fluid of two fluids disposed between the two substrates, wherein the adhesive/sealing material includes particles that alter rheological properties of the adhesive/sealing material.

Figure 7:
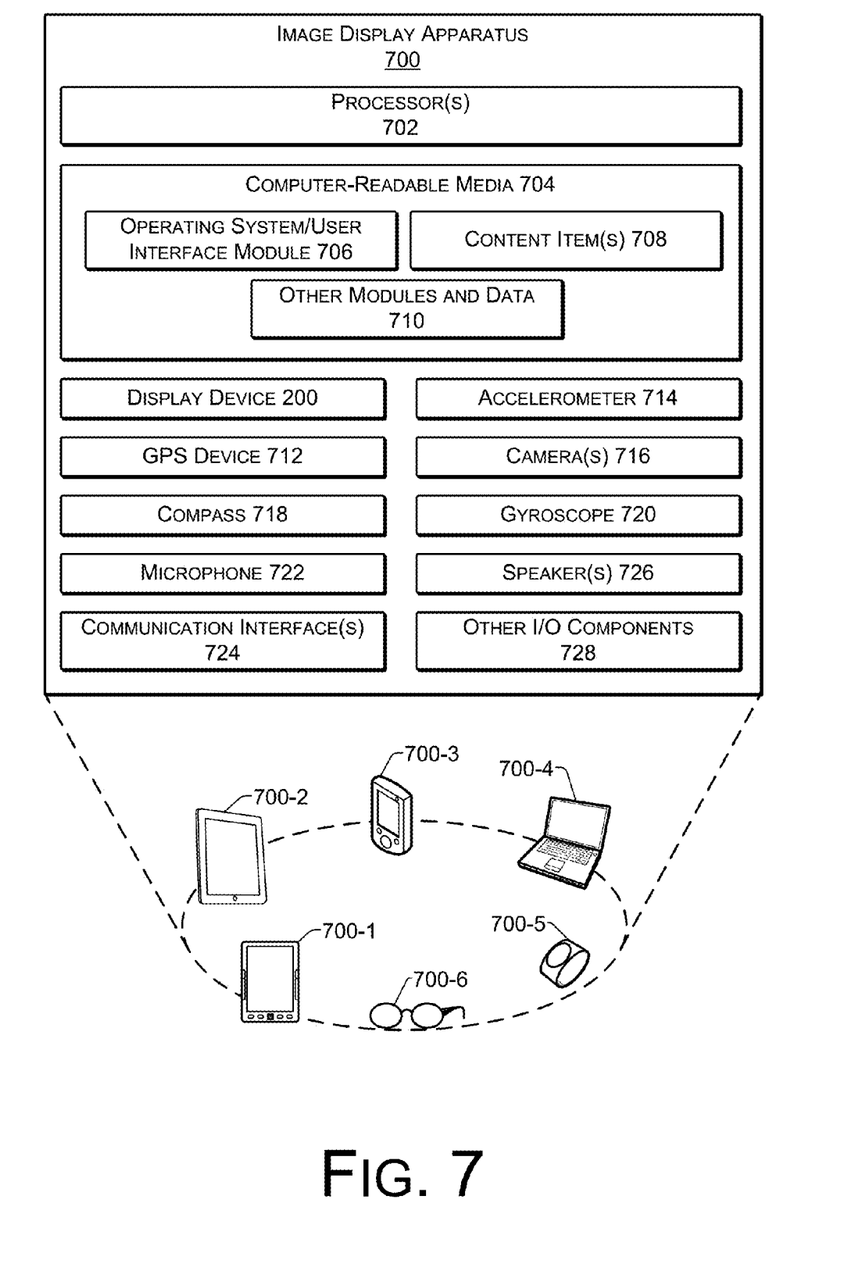
FIG. 7 illustrates select components of an example image display apparatus that may include an electrowetting display, according to various embodiments.

FIG. 7 illustrates select example components of an example image display apparatus 700 that may be used with the electrowetting display device 200 according to some implementations. Other types of displays may also be used with the example image display apparatus 700. Such types of displays include, but are not limited to, LCDs, cholesteric displays, electrophoretic displays, electrofluidic pixel displays, photonic ink displays, and the like.

The image display apparatus 700 may be implemented as any of a number of different types of electronic devices. Some examples of the image display apparatus 700 may include digital media devices and eBook readers 700-1; tablet computing devices 700-2; smart phones, mobile devices and portable gaming systems 700-3; laptop and netbook computing devices 700-4; wearable computing devices 700-5; augmented reality devices, helmets, goggles or glasses 700-6; and any other device capable of connecting with the electrowetting display device 200 and including a processor and memory for controlling the display according to the techniques described herein.

In a very basic configuration, the image display apparatus 700 includes, or accesses, components such as at least one control logic circuit, central processing unit, or processor 702, and one or more computer-readable media 704. Each processor 702 may itself comprise one or more processors or processing cores. For example, the processor 702 can be implemented as one or more microprocessors, microcomputers, microcontrollers, digital signal processors, central processing units, state machines, logic circuitries, and/or any devices that manipulate signals based on operational instructions. In some cases, the processor 702 may be one or more hardware processors and/or logic circuits of any suitable type specifically programmed or configured to execute the algorithms and processes described herein. The processor 702 can be configured to fetch and execute computer-readable instructions stored in the computer-readable media 704 or other computer-readable media. The processor 702 can perform one or more of the functions attributed to the timing controller 202, the data driver 204, and/or the scan driver 206 of the electrowetting display device 200. The processor 702 can also perform one or more functions attributed to a graphic controller (not illustrated) for the electrowetting display device.

Depending on the configuration of the image display apparatus 700, the computer-readable media 704 may be an example of tangible non-transitory computer storage media and may include volatile and nonvolatile memory and/or removable and non-removable media implemented in any type of technology for storage of information such as computer-readable instructions, data structures, program modules or other data. The computer-readable media 704 may include, but is not limited to, RAM, ROM, EEPROM, flash memory or other computer-readable media technology, CD-ROM, digital versatile disks (DVD) or other optical storage, magnetic cassettes, magnetic tape, solid-state storage and/or magnetic disk storage. Further, in some cases, the image display apparatus 700 may access external storage, such as RAID storage systems, storage arrays, network attached storage, storage area networks, cloud storage, or any other medium that can be used to store information and that can be accessed by the processor 702 directly or through another computing device or network. Accordingly, the computer-readable media 704 may be computer storage media able to store instructions, modules or components that may be executed by the processor 702.

The computer-readable media 704 may be used to store and maintain any number of functional components that are executable by the processor 702. In some implementations, these functional components comprise instructions or programs that are executable by the processor 702 and that, when executed, implement operational logic for performing the actions attributed above to the image display apparatus 700. Functional components of the image display apparatus 700 stored in the computer-readable media 704 may include the operating system and user interface module 706 for controlling and managing various functions of the image display apparatus 700, and for generating one or more user interfaces on the electrowetting display device 200 of the image display apparatus 700.

In addition, the computer-readable media 704 may also store data, data structures and the like, that are used by the functional components. For example, data stored by the computer-readable media 704 may include user information and, optionally, one or more content items 708. Depending on the type of the image display apparatus 700, the computer-readable media 704 may also optionally include other functional components and data, such as other modules and data 710, which may include programs, drivers and so forth, and the data used by the functional components. Further, the image display apparatus 700 may include many other logical, programmatic and physical components, of which those described are merely examples that are related to the discussion herein. Further, while the figures illustrate the functional components and data of the image display apparatus 700 as being present on the image display apparatus 700 and executed by the processor 702 on the image display apparatus 700, it is to be appreciated that these components and/or data may be distributed across different computing devices and locations in any manner.

FIG. 7 further illustrates examples of other components that may be included in the image display apparatus 700. Such examples include various types of sensors, which may include a GPS device 712, an accelerometer 714, one or more cameras 716, a compass 718, a gyroscope 720, a microphone 722, and so forth.

The image display apparatus 700 may further include one or more communication interfaces 724, which may support both wired and wireless connection to various networks, such as cellular networks, radio, Wi-Fi networks, close-range wireless connections, near-field connections, infrared signals, local area networks, wide area networks, the Internet, and so forth. The communication interfaces 724 may further allow a user to access storage on or through another device, such as a remote computing device, a network attached storage device, cloud storage, or the like.

The image display apparatus 700 may further be equipped with one or more speakers 726 and various other input/output (I/O) components 728. Such I/O components 728 may include a touchscreen and various user controls (e.g., buttons, a joystick, a keyboard, a keypad, etc.), a haptic or tactile output device, connection ports, physical condition sensors, and so forth. For example, the operating system 706 of the image display apparatus 700 may include suitable drivers configured to accept input from a keypad, keyboard, or other user controls and devices included as the I/O components 728. Additionally, the image display apparatus 400 may include various other components that are not illustrated, examples of which include removable storage, a power source, such as a battery and power control unit, a PC Card component, and so forth.

Various instructions, methods and techniques described herein may be considered in the general context of computer-executable instructions, such as program modules stored on computer storage media and executed by the processors herein. Generally, program modules include routines, programs, objects, components, data structures, etc., for performing particular tasks or implementing particular abstract data types. These program modules, and the like, may be executed as native code or may be downloaded and executed, such as in a virtual machine or other just-in-time compilation execution environment. Typically, the functionality of the program modules may be combined or distributed as desired in various implementations. An implementation of these modules and techniques may be stored on computer storage media or transmitted across some form of communication.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications can be made, and equivalents can be substituted, without departing from claimed subject matter. Additionally, many modifications can be made to adapt a particular situation to the teachings of claimed subject matter without departing from the central concept described herein. Therefore, it is intended that claimed subject matter not be limited to the particular embodiments disclosed, but that such claimed subject matter can also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter can be practiced without these specific details. In other instances, methods, devices, or systems that would be known by one of ordinary skill have not been described in detail so as not to obscure claimed subject matter.

Reference throughout this specification to "one embodiment" or "an embodiment" can mean that a particular feature, structure, or characteristic described in connection with a particular embodiment can be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described can be combined in various ways in one or more embodiments. In general, of course, these and other issues can vary with the particular context of usage. Therefore, the particular context of the description or the usage of these terms can provide helpful guidance regarding inferences to be drawn for that context.

What is claimed is:

1. An electrowetting display device comprising:
a first substrate;
a hydrophobic surface on the first substrate;
an electrowetting oil on the hydrophobic surface and a fluid that includes an electrolyte on the electrowetting oil;
an electrode under the hydrophobic surface;
a thin film transistor coupled to the electrode and a voltage source;
a second substrate; and
an ultraviolet (UV) curable epoxy glue in contact with the fluid and configured to couple the second substrate to the first substrate, wherein the UV curable epoxy glue comprises silica particles in a range of 1-6% mass fraction of silica, wherein the silica particles introduce a yield stress into the UV curable epoxy glue such that the UV curable epoxy glue minimally deforms when in contact with the second fluid.

2. The electrowetting device of claim 1, wherein the silica particles are hydrophobic silica particles.

3. The electrowetting device of claim 1, wherein the silica particles are hydrophilic silica particles.

4. The electrowetting device of claim 1, wherein the silica particles have a size in a range of 7-40 nanometers.

5. An electrowetting display device comprising:
a first substrate and a second substrate;
a first fluid and a second fluid disposed between the first substrate and the second substrate, wherein the first fluid is immiscible with the second fluid; and
an adhesive/sealing material in contact with the first substrate and the second fluid, wherein the adhesive/sealing material couples the second substrate to the first substrate, and wherein the adhesive/sealing material comprises particles that alter rheological properties of the adhesive/sealing material, the particles comprising at least one of (i) silica particles in a range of 1-6% mass fraction silica, (ii) clay particles in a range of 1-6% mass fraction of clay particles or (iii) ceramic particles in a range of 1-6% mass fraction of ceramic particles.

6. The electrowetting device of claim 5, wherein the adhesive/sealing material includes hydrophobic silica particles.

7. The electrowetting device of claim 5, wherein the adhesive/sealing material includes hydrophilic silica particles.

8. The electrowetting device of claim 5, wherein the adhesive/sealing material includes silica particles having a size in a range of 7-40 nanometers.

9. The electrowetting device of claim 5, wherein the adhesive/sealing material includes one or more of (i) clay particles having a size in a range of 7-40 nanometers or (ii) ceramic particles having a size in a range of 7-40 nanometers.

* * * * *